United States Patent
Hu et al.

(10) Patent No.: US 8,562,149 B2
(45) Date of Patent: Oct. 22, 2013

(54) FLEXIBLY CONNECTABLE DIGITAL MICROMIRROR DEVICE MODULE AND PROJECTING APPARATUS EMPLOYING SAME

(75) Inventors: Chia-Chen Hu, Taoyuan Hsien (TW); Yuan-Ming Hsu, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 269 days.

(21) Appl. No.: 13/107,100

(22) Filed: May 13, 2011

(65) Prior Publication Data

US 2011/0285972 A1     Nov. 24, 2011

Related U.S. Application Data

(60) Provisional application No. 61/347,023, filed on May 21, 2010.

(51) Int. Cl.
| | |
|---|---|
| *G03B 21/20* | (2006.01) |
| *G03B 21/26* | (2006.01) |
| *G03B 21/16* | (2006.01) |
| *G02F 1/1345* | (2006.01) |
| *G02F 1/00* | (2006.01) |
| *H01R 12/00* | (2006.01) |
| *H05K 1/00* | (2006.01) |

(52) U.S. Cl.
USPC ............... 353/85; 353/57; 353/60; 349/150; 439/67; 439/77; 439/329; 439/445; 348/771; 359/904

(58) Field of Classification Search
USPC ............. 353/85, 57, 60; 349/150; 439/67, 77, 439/329, 445; 348/771; 359/904
See application file for complete search history.

(56) References Cited

U.S. PATENT DOCUMENTS

| | | | | |
|---|---|---|---|---|
| 5,969,783 | A * | 10/1999 | Takiar et al. ................ | 349/150 |
| 2010/0321282 | A1 * | 12/2010 | Lai et al. ...................... | 345/87 |

* cited by examiner

*Primary Examiner* — Tony Ko
*Assistant Examiner* — Magda Cruz
(74) *Attorney, Agent, or Firm* — Kirton McConkie; Evan R. Witt

(57) ABSTRACT

A digital micromirror device module includes a flexible connection device, a digital micromirror device and a connecting interface. The flexible connection device includes a plurality of conducting wires and an external insulation layer, wherein the conducting wires are discretely arranged and encapsulated by the external insulation layer. The digital micromirror device unit is disposed on the external insulation layer of the flexible connection device and electrically connected with the conducting wires of the flexible connection device. The connecting interface is arranged at a lateral end of the flexible connection device and connected with the conducting wires.

16 Claims, 9 Drawing Sheets

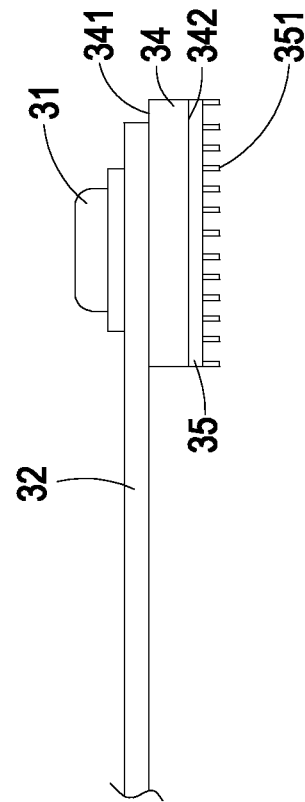
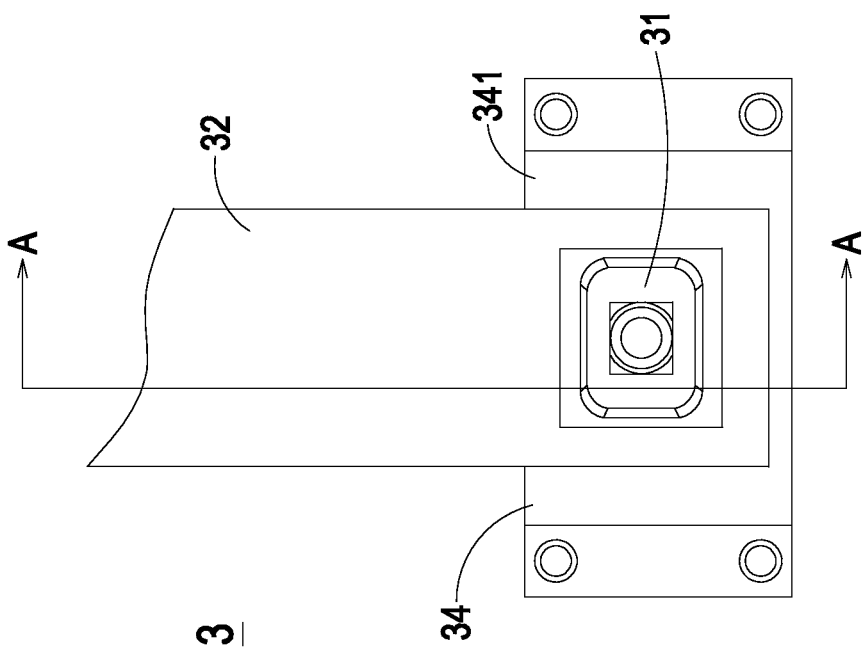
FIG. 4B
FIG. 4A

FLEXIBLY CONNECTABLE DIGITAL MICROMIRROR DEVICE MODULE AND PROJECTING APPARATUS EMPLOYING SAME

CROSS-REFERENCE TO RELATED APPLICATIONS

This application claims the benefit of prior U.S. provisional application 61/347,023, which is entitled "DIGITAL MIRROR DEVICE MODULE WITH FLEXIBLE CONNECTION" and filed on May 21, 2010. The entire disclosures of the above-captioned application are incorporated herein by reference.

FIELD OF THE INVENTION

The present invention relates to a digital micromirror device, and more particularly to a flexibly connectable digital micromirror device for use in a projecting apparatus. The present invention also relates to a projecting apparatus with such a digital micromirror device.

BACKGROUND OF THE INVENTION

With rapid development of digitalized techniques, projectors become essential image display devices in business centers, homes, exhibition halls or other places. Generally, the projectors are classified into two types, i.e. a liquid crystal display (LCD) projector and a digital light processing (DLP) projector. Since the DLP projector has high contrast, rapid response speed and high reliability, the DLP projector becomes a predominant product of the contemporary display devices. Generally, the core element for a DLP projector comprises a main board and a digital micromirror device (DMD) board. The main board comprises a plurality of digital video signal processors. The DMD board comprises a digital micromirror device (DMD) unit. The DMD unit of the DMD board is a principal display unit of the DLP projector.

FIG. 1 schematically illustrates a way of combining a main board with a DMD board according to the prior art. The main board 11 and the DMD board 12 are combined together in a card-inserting manner. The main board 11 has an edge card connector 111. The DMD board 12 comprises a connecting finger portion 121. For assembling the projector, the DMD board 12 is firstly installed within the casing while the connecting finger portion 121 faces upwardly. Then, the main board 11 is moved downwardly toward the DMD board 12 to connect the edge card connector 111 of the main board 11 with the connecting finger portion 121 of the DMD board 12. However, the configurations of FIG. 1 still have some drawbacks. First of all, since a plating step is required to produce the connecting finger portion 121 of the DMD board 12, the manufacturing process is complicated and the manufacturing cost is increased. Also, the edge card connector 111 of the main board 11 requires a relatively high manufacturing cost because of its high precision. Secondly, the assemblage of the main board 11 and the DMD board 12 is achieved in a downward connection manner. That is, the edge card connector 111 of the main board 11 faces downwardly, and the connecting finger portion 121 of the DMD board 12 faces upwardly, so that the main board 11 is moved downwardly to be combined with the DMD board 12. Under this circumstance, the operator fails to ascertain if the edge card connector 111 of the main board 11 and the connecting finger portion 121 of the DMD board 12 are securely connected by sight. Thirdly, the connecting finger portion 121 of the DMD board 12 is prone to be contaminated during the reflow step in the surface mounting process. Therefore, the connecting finger portion 121 would cause poor contacts, which in turn result in poor display image. Finally, the edge card connector 111 has a large dimension in size and is connected with the edge card connectors in a vertical direction. This would hamper the miniaturization of the edge card connector 111. If the edge card connector 111 is downsized, the connecting finger portion 121 would cause poor contacts due to insufficient contact length.

FIG. 2 schematically illustrates another way of combining a main board with a DMD board according to the prior art. The main board 21 and the DMD board 22 are combined together in a board-to-board connecting manner. The main board 21 comprises a first board-to-board connector 211. The DMD board 22 comprises a second board-to-board connector 221. For example, the first board-to-board connector 211 is a female connector, and the second board-to-board connector 221 is a male connector matching the first board-to-board connector 211. For assembling the projector, the DMD board 22 is firstly installed within the casing while the second board-to-board connector 221 faces upwardly. Then, the main board 21 is moved downwardly toward the DMD board 22 to connect the first board-to-board connector 211 of the main board 21 with the second board-to-board connector 221 of the DMD board 22. However, the configurations of FIG. 2 also have some drawbacks. First of all, the board-to-board connectors require high sophistication and manufacturing cost because of high precision. Secondly, the assemblage of the main board 21 and the DMD board 22 is achieved in a downward connection manner. That is, the first board-to-board connector 211 of the main board 21 faces downwardly, and the second board-to-board connector 221 of the DMD board 22 faces upwardly, so that the main board 21 is moved downwardly to be combined with the DMD board 22. Under this circumstance, the operator fails to ascertain if the first board-to-board connector 211 of the main board 21 and the second board-to-board connector 221 of the DMD board 22 are securely connected by sight. Finally, the board-to-board connectors have a large dimension in size and are interconnected in a vertical direction. This would hamper the miniaturization of the board-to-board connectors. If the board-to-board connectors are downsized, the board-to-board connectors would cause poor contacts due to insufficient contact length.

The above assemblage configurations may be referred as inflexible connection configurations. If the mechanical error is too large during the assembling process and the signal transmission quality is deteriorated due to poor contact, such assemblage configurations would hinder the further needs for miniaturization.

SUMMARY OF THE INVENTION

The present invention provides a digital micromirror device module flexibly connectable with a main board through a flexible connection device, thereby increasing the assembling convenience and reliability, providing a better assembling tolerance, and meeting a downsizing requirement.

The present invention provides a digital micromirror device module with a flexible connection device to achieve a board-to-board connecting purpose and reduce the signal attenuation.

The present invention further provides a digital micromirror device module with a flexible connection device, in which the digital micromirror device module has the automatic temperature controlling function and the play-and-plug function, so that the use life of the DMD unit will not be adversely affected by the overheating conditions.

The present invention also provides a projecting apparatus with the digital micromirror device module to achieve the above functions.

In accordance with an aspect of the present invention, there is provided a digital micromirror device module. The digital micromirror device module includes a flexible connection device, a digital micromirror device and a connecting interface. The flexible connection device includes a plurality of conducting wires and an external insulation layer, wherein the conducting wires are discretely arranged and encapsulated by the external insulation layer. The digital micromirror device unit is disposed on the external insulation layer of the flexible connection device and electrically connected with the conducting wires of the flexible connection device. The connecting interface is arranged at a lateral end of the flexible connection device and connected with the conducting wires.

In accordance with another aspect of the present invention, there is provided a projecting apparatus. The projecting apparatus includes a main board and a digital micromirror device module. The main board has an insertion slot. The digital micromirror device module is electrically connected with the main board. The digital micromirror device module includes a flexible connection device, a digital micromirror device and a connecting interface. The flexible connection device includes a plurality of conducting wires and an external insulation layer, wherein the conducting wires are discretely arranged and encapsulated by the external insulation layer. The digital micromirror device unit is disposed on the external insulation layer of the flexible connection device and electrically connected with the conducting wires of the flexible connection device. The connecting interface is arranged at a lateral end of the flexible connection device and connected with the conducting wires. The connecting interface of the digital micromirror device module is electrically and structurally connected with the insertion slot of the main board.

The above contents of the present invention will become more readily apparent to those ordinarily skilled in the art after reviewing the following detailed description and accompanying drawings, in which:

BRIEF DESCRIPTION OF THE DRAWINGS

FIG. 4A schematically illustrates a portion of a digital micromirror device module according to another embodiment of the present invention;

FIG. 4B is a schematic cross-sectional view of the digital micromirror device module of FIG. 4A and taken along the line AA;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
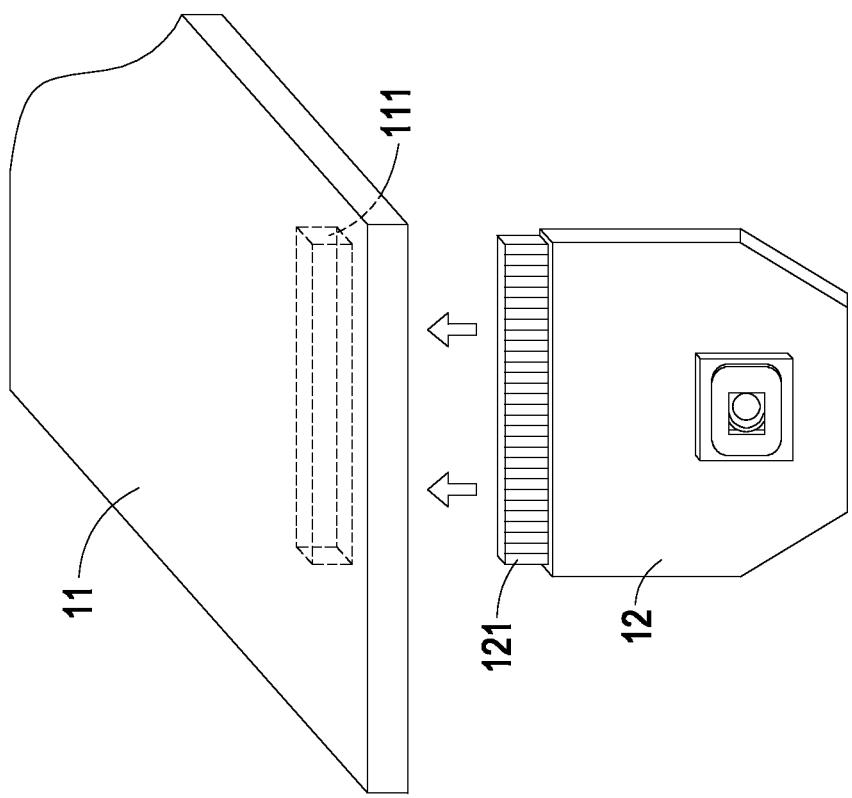
FIG. 1 schematically illustrates a way of combining a main board with a DMD board according to the prior art.
Figure 2:
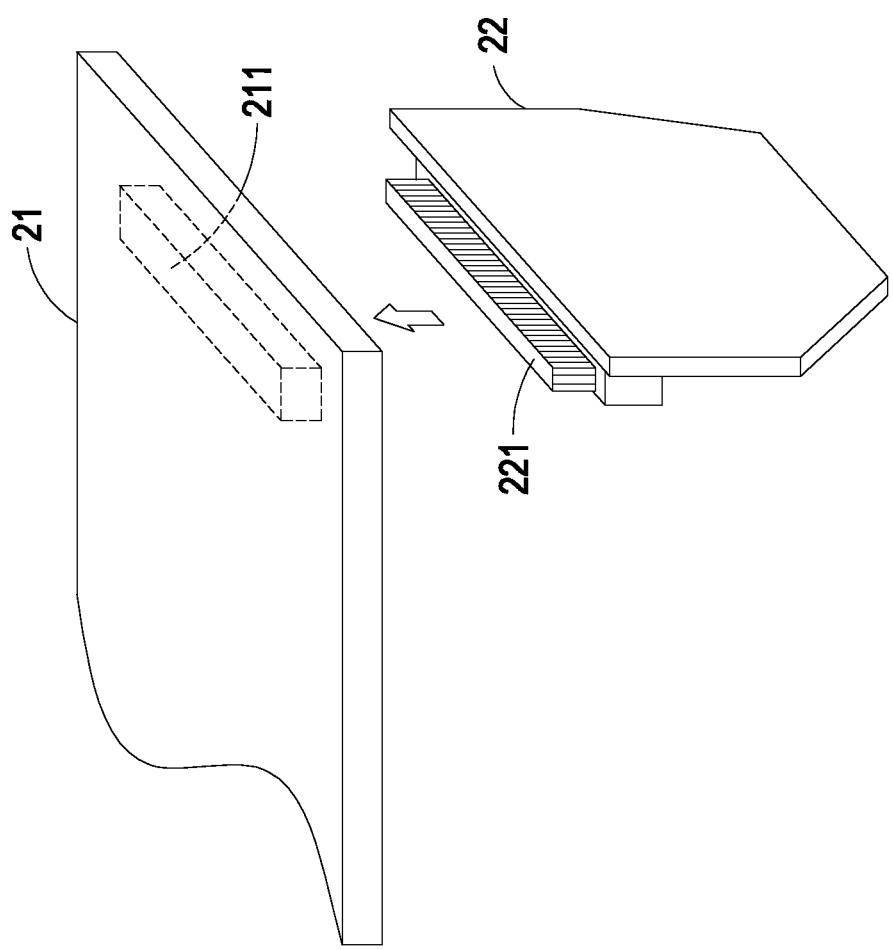
FIG. 2 schematically illustrates another way of combining a main board with a DMD board according to the prior art.
Figure 3:
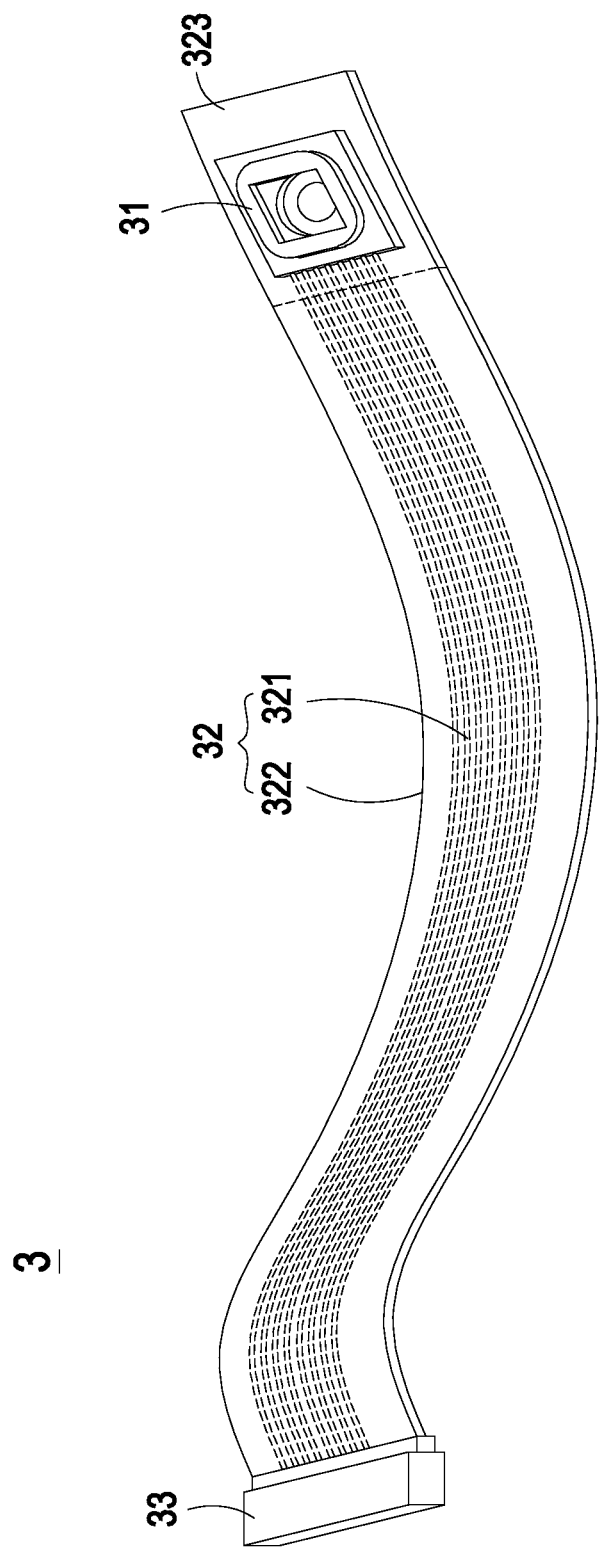
FIG. 3 schematically illustrates a digital micromirror device module according to an embodiment of the present invention.

FIG. 3 schematically illustrates a digital micromirror device module according to an embodiment of the present invention. As shown in FIG. 3, the digital micromirror device module 3 comprises a digital micromirror device (DMD) unit 31 a flexible connection device 32. An example of the flexible connection device 32 includes but is not limited to a flexible flat cable or a flexible printed circuit board. The flexible connection device 32 comprises a plurality of conducting wires 321 and an external insulation layer 322. These conducting wires 321 are discretely arranged and encapsulated by the external insulation layer 322. The DMD unit 31 is mounted on the external insulation layer 322 of the flexible connection device 32. Moreover, the DMD unit 31 is electrically connected with one or more conducting wires 321. The digital micromirror device module 3 further comprises a connecting interface 33. The connecting interface 33 is arranged at a lateral end of the flexible connection device 32 and connected with the conducting wires 321. In some embodiments, the DMD unit 31 is mounted on the external insulation layer 322 of the flexible connection device 32 by a surface mount technology and electrically connected with the conducting wires 321.

FIG. 4A schematically illustrates a portion of a digital micromirror device module according to another embodiment of the present invention. FIG. 4B is a schematic cross-sectional view of the digital micromirror device module of FIG. 4A and taken along the line AA. In comparison with the digital micromirror device module of FIG. 3, the digital micromirror device module 3 of this embodiment further comprises a supporting plate 34. The supporting plate 34 is configured to support the DMD unit 31 and fixing a portion of the flexible connection device 32. In addition, the DMD unit 31 and the supporting plate 34 are disposed at opposite sides of an edge part 323 of the flexible connection device 32 (see also FIG. 3). The supporting plate 34 has a first supporting surface 341 and a second supporting surface 342. The first supporting surface 341 and the second supporting surface 342 are opposed to each other. Moreover, the first supporting surface 341 and the second supporting surface 342 are used for supporting the DMD unit 31 and fixing the edge part 323 of the flexible connection device 32, respectively. In this embodiment, the supporting plate 34 is a printed circuit board or a flat plate. The edge part 323 of the flexible connection device 32 may be fixed on the first supporting surface 341 by an adhesive or other connecting means.

In some embodiments, the digital micromirror device module 3 further comprises a heat sink 35. The heat sink 35 is attached on the second supporting surface 342 of the supporting plate 34 for dissipating the heat that is generated from the DMD unit 31. That is, the heat from the DMD unit 31 and the supporting plate 34 may be removed by the heat sink 35. For increasing the surface area of the heat sink 35, the outer surface of the heat sink 35 may includes a plurality of fins 351.

Figure 6:
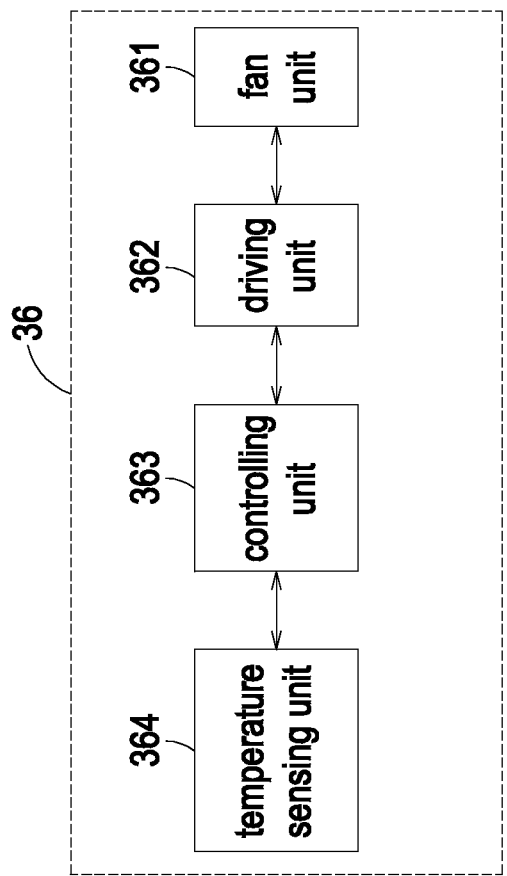
FIG. 6 is a schematic functional block diagram illustrating the active heat-dissipating device of the digital micromirror device module of FIG. 5.
Figure 5:
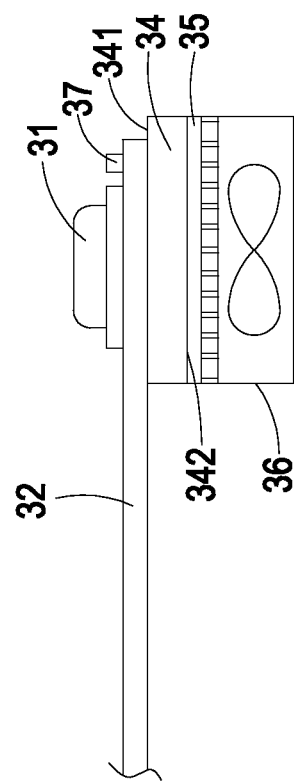
FIG. 5 schematically illustrates a portion of a digital micromirror device module according to a further embodiment of the present invention.

FIG. 5 schematically illustrates a portion of a digital micromirror device module according to a further embodiment of the present invention. In comparison with the digital micromirror device module of FIG. 4, the digital micromirror device module 3 of this embodiment further comprises an active heat-dissipating device 36. The active heat-dissipating device 36 is directly disposed on the second supporting surface 342 of the supporting plate 34 or the heat sink 35 for dissipating the heat that is generated from the DMD unit 31. In this embodiment, the active heat-dissipating device 36 is disposed on the heat sink 35. The digital micromirror device module 3 further comprises a plurality of electronic components 37 such as resistors, inductors, capacitors, sensors and the like. The electronic components 37 are electrically connected with the conducting wires 321 of the flexible connection device 32 by a surface mount technology. FIG. 6 is a schematic functional block diagram illustrating the active heat-dissipating device of the digital micromirror device module of FIG. 5. In an embodiment, the active heat-dissipating device 36 is an automatic temperature-controlled fan. The automatic temperature-controlled fan comprises a fan unit 361, a driving unit 362, a controlling unit 363 and a temperature sensing unit 364. The fan unit 361 is connected with the driving unit 362 for creating a heat-dissipating airflow. The driving unit 362 is connected with the controlling unit 363. Under control of the controlling unit 363, the operations of the driving unit 362 are driven by the driving unit 362. The temperature sensing unit 364 is connected with the controlling unit 363 for detecting the temperature of the digital micromirror device module 3. According to the temperature detected by the temperature sensing unit 364, the driving unit 362 is controlled by the driving unit 362 to adjust the rotating speed of the fan unit 361. Consequently, the DMD unit 31 can be operated at the constant temperature, and the use life of the DMD unit 31 will not be adversely affected by the overheating conditions.

Figure 7A:
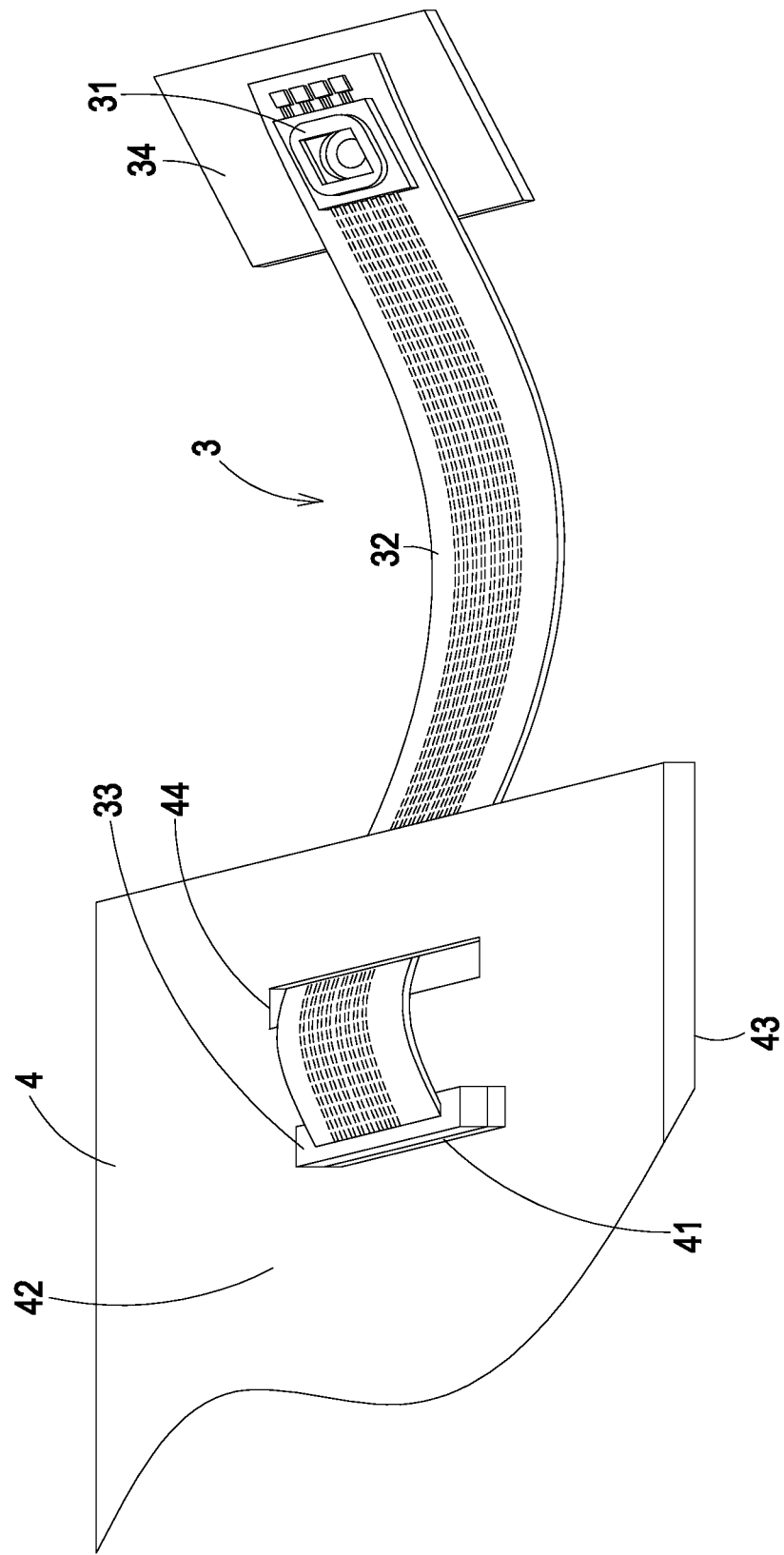
FIG. 7A schematically illustrates the connection between the digital micromirror device module and a main board according to an embodiment of the present invention.

FIG. 7A schematically illustrates the connection between the digital micromirror device module and a main board according to an embodiment of the present invention. By inserting the connecting interface 33 into a corresponding insertion slot 41 of the main board 4, the digital micromirror device module 3 can be electrically and structurally connected with the main board 4. The main board 4 comprises a first surface 42 and a second surface 43. The first surface 42 and the second surface 43 are opposed to each other. The insertion slot 41 is disposed on the first surface 42 of the main board 4. The main board 4 further comprises a hollow portion 44. The connecting interface 33 and the flexible connection device 32 of the digital micromirror device module 3 can be penetrated through the hollow portion 44. For combining the digital micromirror device module 3 with the main board 4, the connecting interface 33 and a portion of the flexible connection device 32 of the digital micromirror device module 3 are penetrated through the hollow portion 44 from the second surface 43 to the first surface 42 of the main board 4. After the connecting interface 33 is inserted into the insertion slot 41, the flexible connection between the digital micromirror device module 3 and the main board 4 is achieved. Meanwhile, according to the layout space within the casing of the projector, the locations of the main board 4 and the digital micromirror device module 3 are adjustable.

Figure 7B:
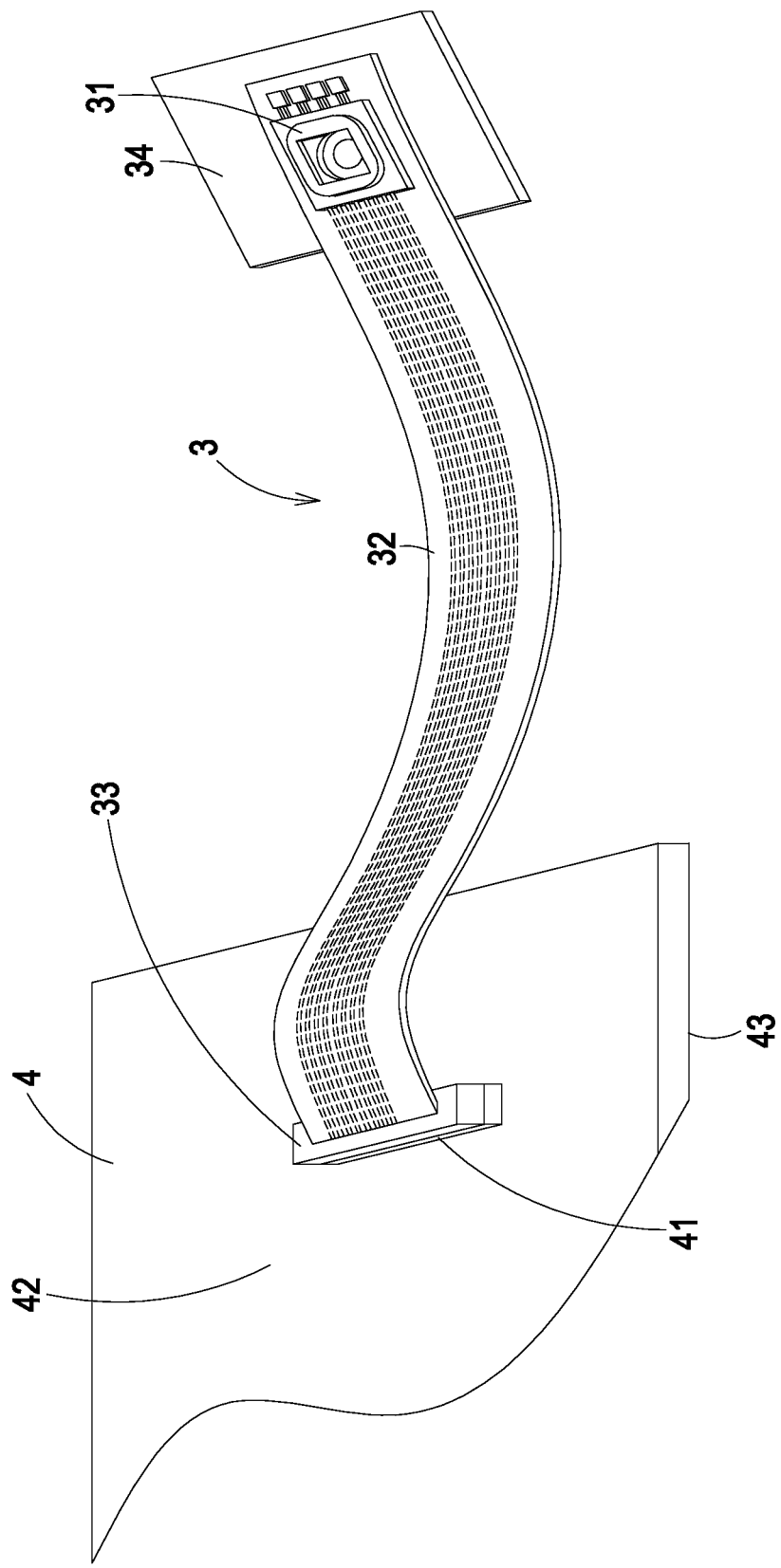
FIG. 7B schematically illustrates the connection between the digital micromirror device module and a main board according to another embodiment of the present invention.

FIG. 7B schematically illustrates the connection between the digital micromirror device module and a main board according to another embodiment of the present invention. In this embodiment, the hollow portion 44 is exempted from the main board 4. By directly inserting the connecting interface 33 into a corresponding insertion slot 41 of the main board 4, the digital micromirror device module 3 can be electrically and structurally connected with the main board 4.

Figure 7C:
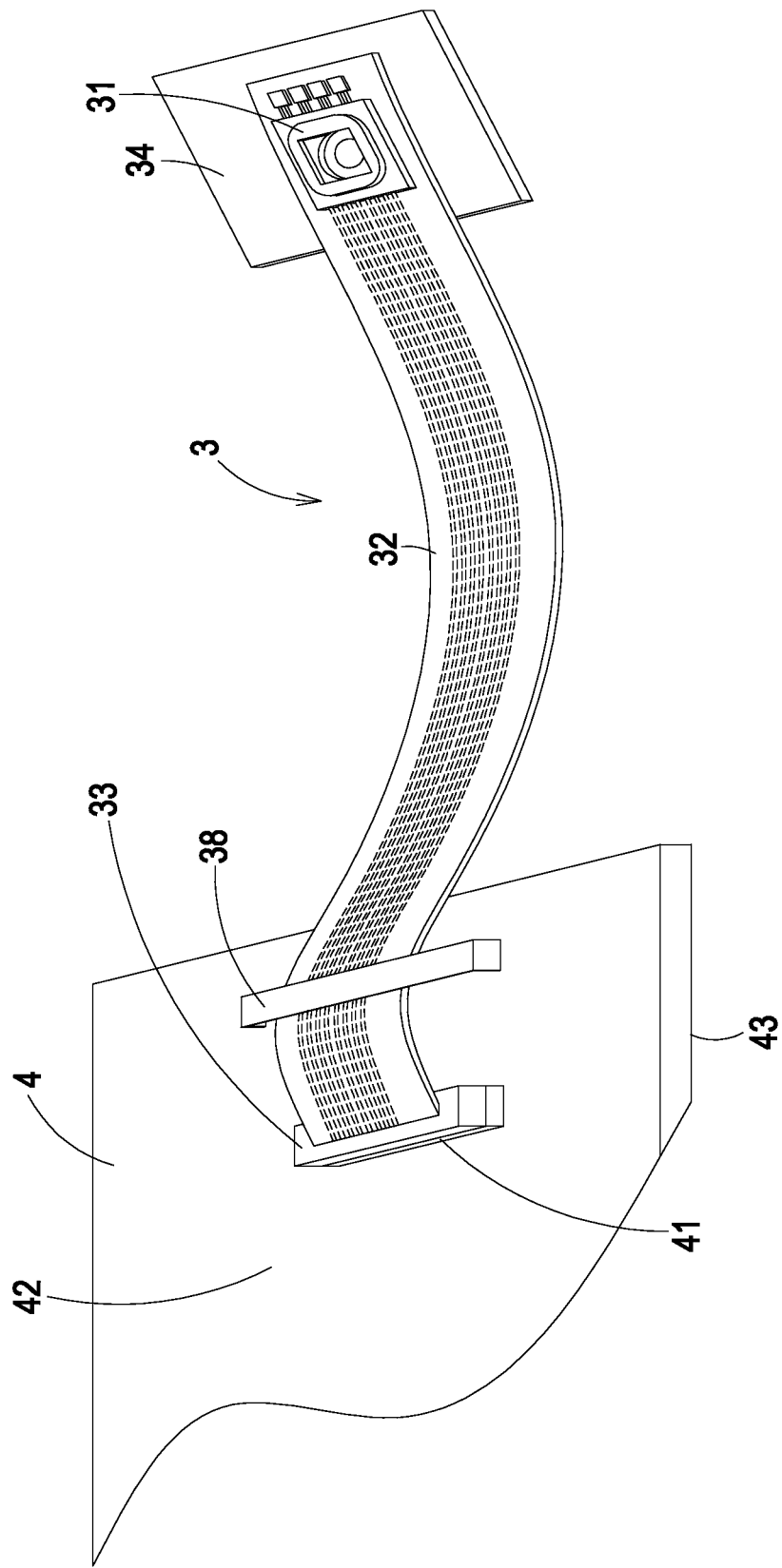
FIG. 7C schematically illustrates the connection between the digital micromirror device module and a main board according to a further embodiment of the present invention.

FIG. 7C schematically illustrates the connection between the digital micromirror device module and a main board according to a further embodiment of the present invention. For increasing the quality of transmitting signals through the flexible connection device 32 and reducing the noise, an electromagnetic interference (EMI) suppression element 38 such as a metal sheet may be attached on the flexible connection device 32 to press the flexible connection device 32. Due to the EMI suppression element 38, the electromagnetic interference is reduced and the signal transmission quality is enhanced.

Figure 8:
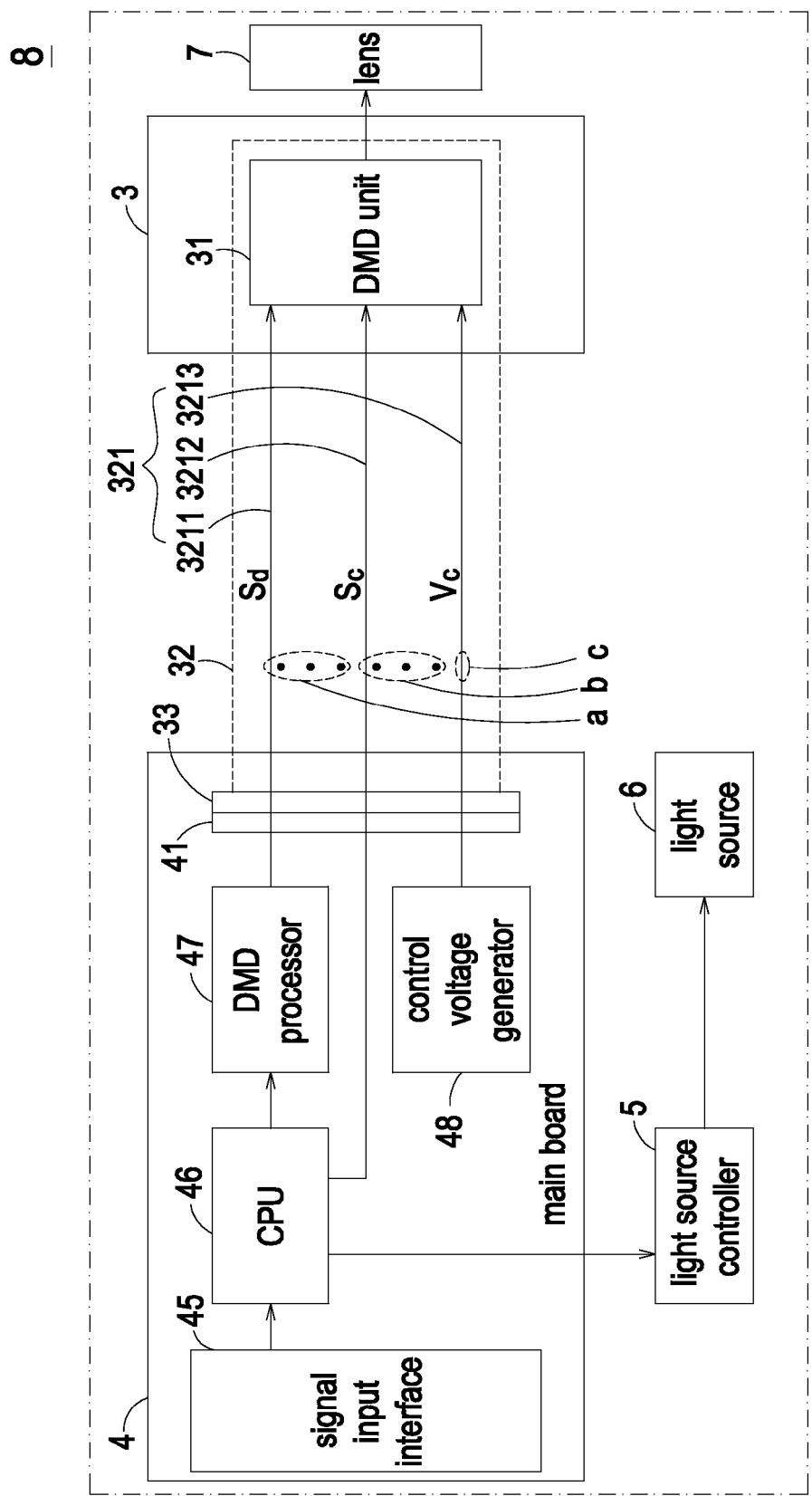
FIG. 8 is a schematic block diagram illustrating a projecting apparatus with the digital micromirror device module of the present invention.

FIG. 8 is a schematic block diagram illustrating a projecting apparatus with the digital micromirror device module of the present invention. As shown in FIG. 8, the projecting apparatus 8 comprises a digital micromirror device module 3, a main board 4, a light source controller 5, a light source 6 and a lens 7. The digital micromirror device module 3 and the main board 4 are electrically connected with each other. For example, the relation between the digital micromirror device module 3 and the main board 4 may be illustrated with reference to FIG. 7A. The light source 6 is used for emitting light beams. The main board 4 is connected with the light source controller 5 for controlling operations of the light source controller 5. The light source controller 5 is connected with the light source 6 for controlling the light source 6 to emit light beams. In this embodiment, the main board 4 comprises a signal input interface 45, a central processing unit (CPU) 46, a digital micromirror device processor 47 and a control voltage generator 48. The signal input interface 45 is used for receiving an image signal from an image signal source (not shown). The central processing unit 46 is connected with the signal input interface 45 and the digital micromirror device processor 47. In addition, the central processing unit 46 is connected with the DMD unit 31 through the insertion slot 41, the connecting interface 33 and the flexible connection device 32. The central processing unit 46 is configured to receive, convert and process the image signal, transmit the converted and processed image signal to the digital micromirror device processor 47, and transmit a control signal Sc to the DMD unit 31 for controlling operations of the DMD unit 31. The digital micromirror device processor 47 is connected with the central processing unit 46. In addition, the digital micromirror device processor 47 is connected with the DMD unit 31 through the insertion slot 41, the connecting interface 33 and the flexible connection device 32. The digital micromirror device processor 47 is configured to generate a data signal Sd according to the image signal and transmit the data signal Sd to the DMD unit 31. The control voltage generator 48 is connected with the DMD unit 31 of the digital micromirror device module 3 for providing a control voltage Vc required to operate the DMD unit 31. In other words, the rotating angles and operations of the reflective mirrors (not shown) of the DMD unit 31 can be controlled by the central processing unit 46, the digital micromirror device processor 47 and the control voltage generator 48.

The light source controller 5 is connected with the central processing unit 46 of the main board 4 and the light source 6. Under control of the central processing unit 46, the light source controller 5 may control the light source 6 to emit light beams and project the light beams onto the DMD unit 31 of the digital micromirror device module 3. The operations of the reflective mirrors (not shown) of the DMD unit 31 are controlled by the digital micromirror device processor 47, the central processing unit 46 and the control voltage generator 48. The light beams reflected from the reflective mirrors of the DMD unit 31 are directed to the lens 7 through an optical path, so that a projecting image is produced.

Please refer to FIG. 8 again. The flexible connection device 32 comprises a plurality of conducting wires 321. These conducting wires 321 comprise data signal wires 3211, control signal wires 3212 and control power wires 3213. For example, the number of conducting wires 321 is 8 to 16. For achieving better signal transmission quality and reducing signal interference, these conducting wires 321 are arranged at various zones according to the types of the to-be-transmitted signals. For example, the data signal wires 3211, the control signal wires 3212 and the control power wires 3213 are arranged at a first zone a, a second zone b and a third zone c, respectively. Moreover, the spacing interval between adjacent zones is wider than the spacing interval between adjacent wires. In some embodiments, at least one ground wire is arranged between the first zone a, the second zone b and the third zone c for further achieving better signal transmission quality and reducing signal interference. For example, at least one ground wire is arranged between the second zone b of the control signal wires 3212 and the third zone c of the control power wires 3213.

From the above description, the present invention provides a digital micromirror device module for use in a projecting apparatus. The digital micromirror device module has a flexible connection device to be flexibly connected with a main board. Consequently, the use of the digital micromirror device module is capable of increasing the assembling convenience and reliability, providing a better assembling tolerance, and meeting a downsizing requirement. Moreover, the digital micromirror device module with a flexible connection device may achieve a board-to-board connecting purpose and reduce the signal attenuation. Since the digital micromirror device module has the automatic temperature controlling function and the play-and-plug function, the use life of the DMD unit will not be adversely affected by the overheating conditions.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A digital micromirror device module, comprising:
    a flexible connection device comprising a plurality of conducting wires and an external insulation layer, wherein said conducting wires are discretely arranged and encapsulated by said external insulation layer;
    a digital micromirror device unit disposed on said external insulation layer of said flexible connection device and electrically connected with said conducting wires of said flexible connection device;
    a supporting plate for supporting said digital micromirror device unit and fixing an edge part of said flexible connection device; and
    a connecting interface arranged at a lateral end of said flexible connection device and connected with said conducting wires.

2. The digital micromirror device module according to claim 1 wherein said flexible connection device is a flexible flat cable or a flexible printed circuit board.

3. The digital micromirror device module according to claim 1 wherein said digital micromirror device unit is mounted on said external insulation layer of said flexible connection device by a surface mount technology and electrically connected with said conducting wires.

4. The digital micromirror device module according to claim 1, wherein said supporting plate has a first supporting surface and a second supporting surface, said first supporting surface and said second supporting surface are opposed to each other, and said digital micromirror device unit and said edge part of said flexible connection device are supported by said first supporting surface of said supporting plate.

5. The digital micromirror device module according to claim 4 wherein said supporting plate is a printed circuit board or a flat plate.

6. The digital micromirror device module according to claim 4 further comprising a heat sink, which is disposed on said second supporting surface of said supporting plate for dissipating heat generated from said digital micromirror device unit.

7. The digital micromirror device module according to claim 6 further comprising an active heat-dissipating device, which is disposed on said second supporting surface of said supporting plate or said heat sink for dissipating heat generated from said digital micromirror device unit.

8. The digital micromirror device module according to claim 7 wherein said active heat-dissipating device is an automatic temperature-controlled fan, and comprises:
    a temperature sensing unit for detecting a temperature of said digital micromirror device module;
    a fan unit for creating a heat-dissipating airflow;
    a driving unit connected with said fan unit for driving operations of said fan unit; and
    a controlling unit connected with said temperature sensing unit and said driving unit for controlling said driving unit to adjust a rotating speed of said fan unit according to said temperature.

9. The digital micromirror device module according to claim 1 wherein said conducting wires comprises data signal wires, control signal wires and control power wires, which are arranged at different zone of said flexible connection device.

10. The digital micromirror device module according to claim 9 wherein said conducting wires further comprises at least one ground wire, which is arranged between said control signal wires and said control power wires.

11. A projecting apparatus, comprising:
    a main board having an insertion slot; and
    a digital micromirror device module electrically connected with said main board, and comprising:
        a flexible connection device comprising a plurality of conducting wires and an external insulation layer, wherein said conducting wires are discretely arranged and encapsulated by said external insulation layer;
        a digital micromirror device unit disposed on said external insulation layer of said flexible connection device and electrically connected with said conducting wires of said flexible connection device; and
        a connecting interface arranged at a lateral end of said flexible connection device and connected with said conducting wires, wherein said connecting interface of said digital micromirror device module is electrically and structurally connected with said insertion slot of said main board.

12. The projecting apparatus according to claim 11 wherein said main board has a first surface and a second surface, wherein said first surface and said second surface are opposed to each other, and said insertion slot is disposed on said first surface of said main board.

13. The projecting apparatus according to claim 12 wherein said main board further comprises a hollow portion, wherein said connecting interface and a portion of said flexible connection device is penetrated through said hollow portion from the second surface to said first surface of said main board.

14. The projecting apparatus according to claim 11 further comprising an electromagnetic interference suppression element, which is attached on said flexible connection device.

15. The projecting apparatus according to claim 11 further comprising:
    a light source for emitting light beams;
    a light source controller connected with said main board and said light source for controlling said light source to emit said light beams; and
    a lens for processing said light beams reflected from said digital micromirror device unit into a projecting image.

16. The projecting apparatus according to claim 11 wherein said main board comprises:
    a signal input interface for receiving an image signal from an image signal source;
    a digital micromirror device processor connected with said digital micromirror device unit of said digital micromirror device module for generating a data signal according to said image signal, and transmitting said data signal to said digital micromirror device unit;
    a central processing unit connected with said signal input interface, said digital micromirror device processor and digital micromirror device unit of said digital micromirror device module for receiving, converting and processing said image signal, transmitting said converted and processed image signal to said digital micromirror device processor, and transmitting a control signal to said digital micromirror device unit; and
a control voltage generator connected with said digital micromirror device unit of said digital micromirror device module for providing a control voltage to said digital micromirror device unit, wherein under control of said central processing unit, said digital micromirror device processor and said control voltage generator, said digital micromirror device unit is operated according to said control signal, said data signal and said control voltage.

* * * * *